Figure 1:
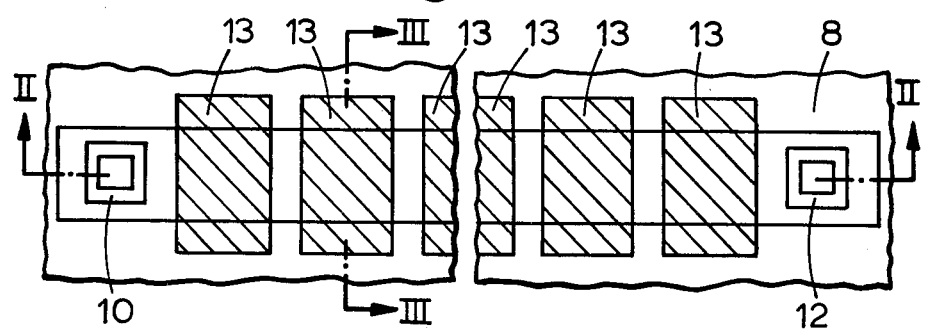

United States Patent [19]

Shannon

[11] 4,210,922
[45] Jul. 1, 1980

[54] CHARGE COUPLED IMAGING DEVICE HAVING SELECTIVE WAVELENGTH SENSITIVITY

[75] Inventor: John M. Shannon, Whyteleafe, England

[73] Assignee: U.S. Philips Corporation, New York, N.Y.

[21] Appl. No.: 917,848

[22] Filed: Jun. 22, 1978

Related U.S. Application Data

[63] Continuation of Ser. No. 745,477, Nov. 26, 1976, abandoned.

[30] Foreign Application Priority Data

Nov. 28, 1975 [GB] United Kingdom ............... 49089/75

[51] Int. Cl.$^2$ ..................... H01L 29/78; H01L 27/14; H01L 31/00; H01L 29/167
[52] U.S. Cl. ...................................... 357/24; 357/30; 357/64; 357/91; 307/221 D; 250/338; 250/370
[58] Field of Search ....................... 357/24, 30, 64, 91, 357/29; 307/221 D; 250/338, 370

[56] References Cited

U.S. PATENT DOCUMENTS

| | | | |
|---|---|---|---|
| 3,829,885 | 8/1974 | Nishizawa et al. ................... | 357/24 |
| 3,978,509 | 8/1976 | Gouin et al. ............................ | 357/30 |
| 3,979,604 | 9/1976 | Bate ................................... | 307/221 D |
| 4,004,148 | 1/1977 | Howard et al. ........................ | 357/30 |
| 4,028,716 | 6/1977 | van Santen et al. ................... | 357/24 |
| 4,028,719 | 6/1977 | Curtis ................................... | 357/24 |

OTHER PUBLICATIONS

Steckl et al., "Application of Charge-coupled Devices to Infrared Detection and Imaging", Proc. IEEE, vol. 63 (1/75), pp. 67-74.
Steckl "Low Temperature Silicon CCD Operation", Int. Conf. Application of CCD'S, San Diego (10/75), Proc. pp. 383-388.
Nummedal et al., "Extrinsic Silicon Monolithic Focal Plane Array . . .", Int. Conf. Application of CCD'S, San Diego (10/75), Proc. pp. 19-30.
Nelson, "Accumulation-Mode Charge-coupled Device", Applied Physics Letters, vol. 25 (11/74), pp. 568-570.

Primary Examiner—Gene M. Munson
Attorney, Agent, or Firm—Thomas A. Briody; Jack Oisher; Steven R. Biren

[57] ABSTRACT

A bulk channel charge coupled imaging device having selective wavelength sensitivity includes a semiconductor layer in which pattern information in the form of discrete packets of majority charge carriers is generated and transported. The semiconductor layer has a concentration of at least one doping impurity characteristic of its conductivity type and a concentration of at least one deep level impurity which provides centers for trapping majority charge carriers. The doping impurity concentration and the deep level impurity concentration are such that depletion regions can be formed extending through the thickness of the layer while avoiding breakdown only as a result of substantially all the deep level centers within the depletion regions being full of majority charge carriers characteristic of the conductivity type of the semiconductor layer.

14 Claims, 6 Drawing Figures

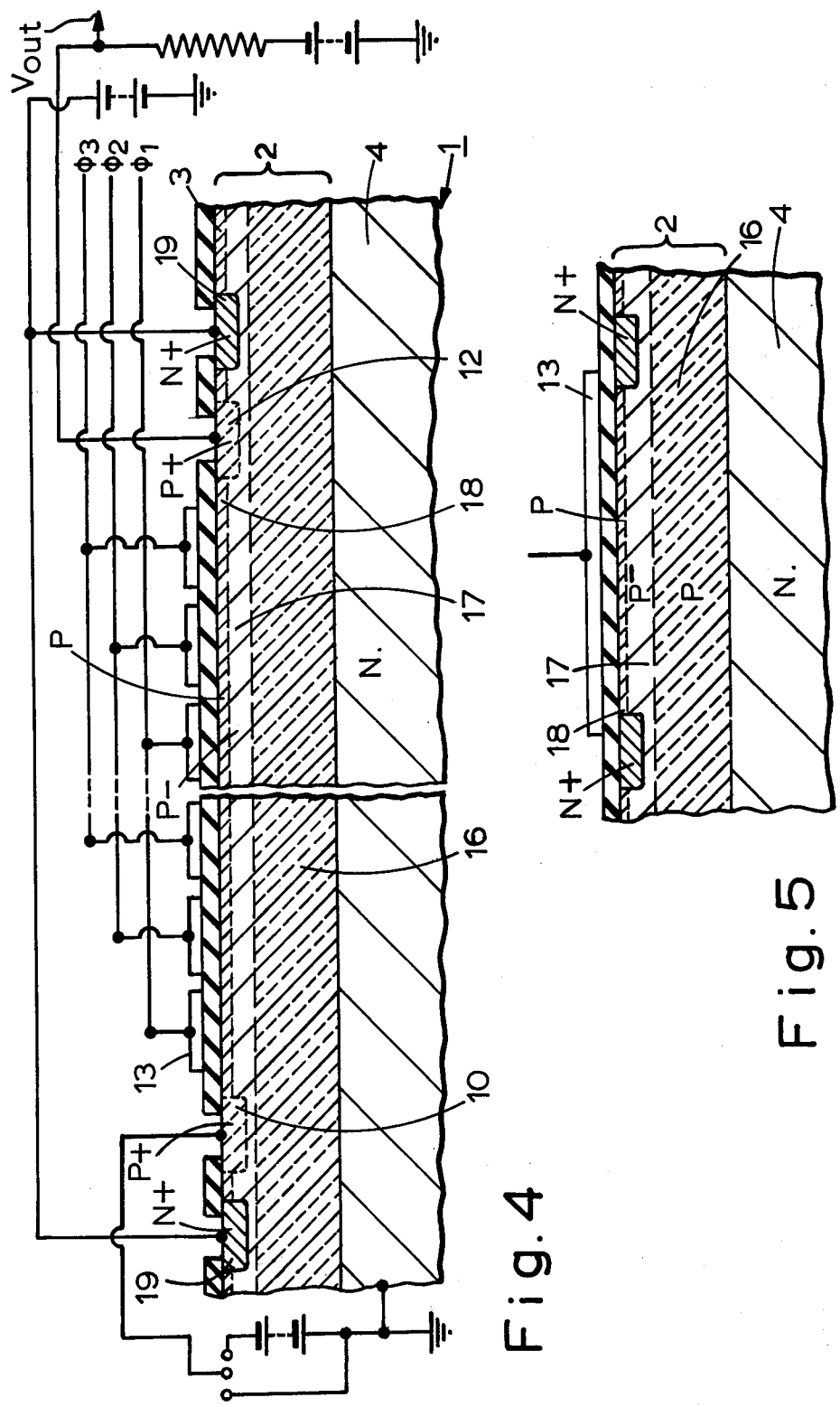

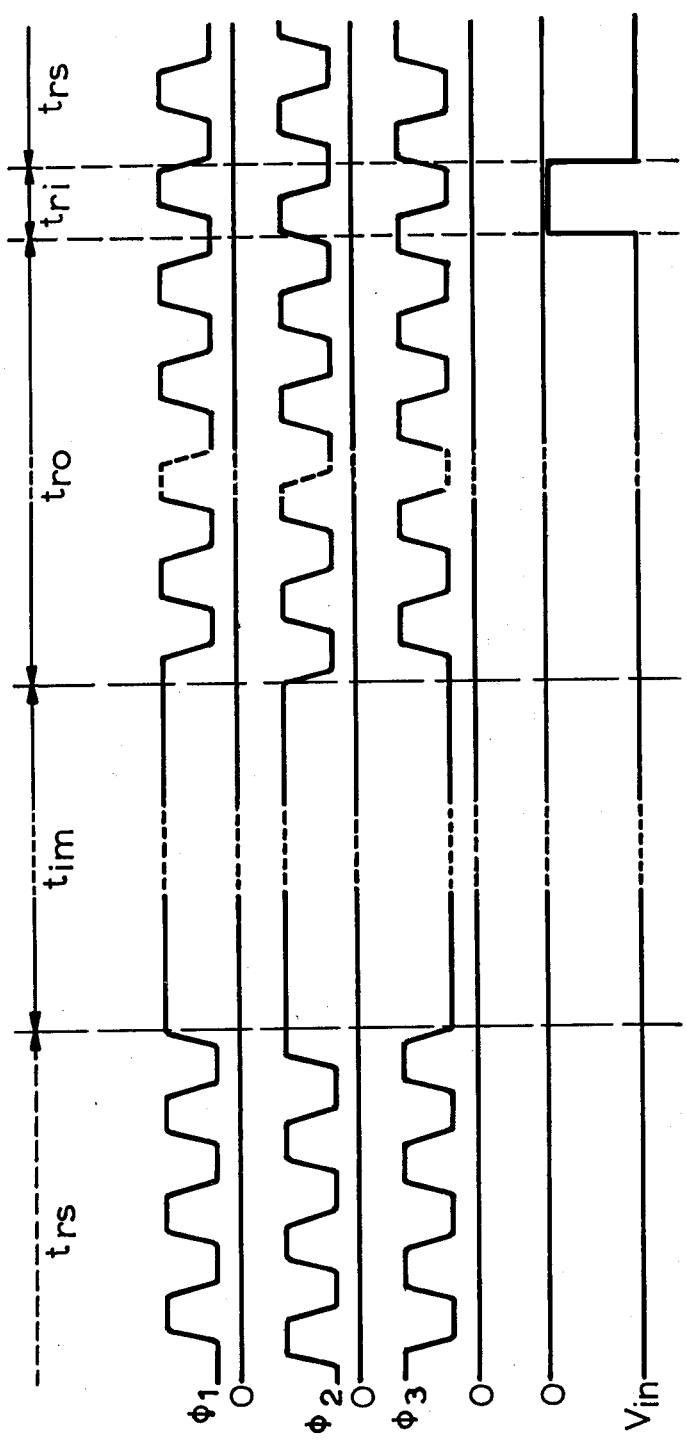

CHARGE COUPLED IMAGING DEVICE HAVING SELECTIVE WAVELENGTH SENSITIVITY

This is a continuation, of application Ser. No. 745,477, filed Nov. 26, 1976, now abandoned.

This invention relates to charge coupled devices for converting an electromagnetic radiation pattern in a certain wavelength range, particularly but not exclusively an infra-red radiation pattern, into electrical signals.

Charge coupled devices for imaging purposes are now well established and find application as image sensors in experimental television cameras.

Charge coupled devices as first proposed were based on the storage in depletion regions and transport adjacent the surface of a semiconductor layer of one conductivity type of discrete packets of charge in the form of minority charge carriers. Thus when employing an n-type layer the storage and transport is of holes. Such devices are generally referred to as surface channel charge coupled devices. In a later development improved efficiency of the charge transfer between adjacent storage sites is obtained in a structure in which the storage and transport is of majority charge carriers, said transport being effected via the interior of the semiconductor layer. These devices, which may sometimes be referred to as bulk or buried channel charge coupled devices, are described in our United Kingdom Patent Specification No. 1,414,183 which corresponds to U.S. Ser. No. 504,372. Such a device comprises a semiconductor body having a semiconductor layer of one conductivity type, means being present for electrically isolating, at least during operation, the semiconductor layer from the surrounding thereof, said layer having such a thickness and doping concentration that a depletion region can be obtained throughout the thickness of the semiconductor layer by means of an electric field while avoiding breakdown. The device also comprises means to locally introduce into the semiconductor layer information in the form of charge consisting of majority charge carriers and means to read out said information elsewhere in the layer, an electrode system being present at least at one side of the layer to capacitively produce electric fields in the semiconductor layer by means of which the charge can be transported to the read-out means via the interior of the semiconductor layer in a direction parallel to the layer. Such a device may be constructed for imaging purposes whereby the local introduction of information in the form of majority charge carriers comprises the generation of electron-hole pairs by the absorption of incident radiation in the vicinity of depletion regions formed in the semiconductor layer adjacent the electrode system.

In order to be able to use the known charge coupled devices for imaging purposes it is necessary that the photon energy of the incident radiation be greater than the band gap of the semiconductor material. This enables for example visible radiation with an energy greater than 1.1 eV to be detected using a silicon CCD, both the surface channel and bulk or buried channel configurations being suitable for this purpose.

For imaging of an infra-red radiation pattern, charge coupled devices have been proposed in various different forms. In one, so-called "hybrid", form the functions of detection and signal processing are performed in separate but integratable components by an array of infra-red detector elements individually connected to a silicon charge coupled device shift register. The function of the silicon CCD in this case is that of a signal processor performing appropriate functions. In another, so-called "monolithic", form the functions of detection and signal processing are performed in the same part of the semiconductor body. In one proposed form of "monolithic" CCD for infra-red imaging the operation and structure is essentially similar to that of a silicon surface channel CCD and is based on the generation of depletion regions adjacent the semiconductor surface where photogenerated minority charge carriers are collected. The device differs from conventional silicon imaging CCD's in the material used in the semiconductor layer. The material has to be chosen so that the absorption peak is in the infra-red region, the band gap of the semiconductor material being less than the energy of the infra-red photons. Therefore the material is restricted to certain narrow band gap semiconductors among the binary and ternary III-V, II-VI and IV-VI compounds. This to a certain extent is disadvantageous because the materials and processing technology is not as well developed as in silicon, it being appreciated that while the basic charge storage and transfer operation of a CCD need not be dependent upon the presence of a p-n junction, it is nevertheless desired in many practical embodiments to incorporate regions of opposite conductivity type into the layer in which charge storage and transport occurs.

In another proposed "monolithic" form of infra-red CCD imaging device operation is based on the accumulation of majority charge carriers (electrons) at the surface of an n-type silicon layer and their transfer adjacent the surface, said electrons being released from deep donor levels provided throughout an n-type silicon layer. Operation of this device requires cooling to a low temperature in order to minimize the thermal generation of majority charge carriers and the inherent disadvantages of a conventional surface channel in terms of charge transfer efficiency and speed of operation are accentuated.

According to the invention a charge coupled device for converting an electromagnetic radiation pattern in a certain wavelength range into electrical signals comprises a semiconductor body having a semiconductor layer of one conductivity type in which pattern information in the form of discrete packets of majority charge carriers can be generated and transported via the interior of the semiconductor layer to means for reading the charge, the layer comprising a concentration of at least one doping impurity characteristic of the one conductivity type and a concentration of at least one deep level impurity as herein defined which provides centers for the trapping of majority charge carriers which can be released upon excitation by radiation in the said wavelength range, the doping impurity concentration and the deep level impurity concentration being provided so that depletion regions can be formed extending across the thickness of the layer while avoiding breakdown only as a result of substantially all the deep level centers within the depletion regions being full of majority charge carriers characteristic of the one conductivity type.

Reference herein to a deep level impurity is to be understood to mean an impurity which is in a given charge state in the bulk semiconductor material in thermal equilibrium and whose charge state changes in a depletion region in a steady state. This means that the energy level of a deep level impurity in n-type material must be below the Fermi level (of the semiconductor material in equilibrium) in the upper half of the band gap and the energy level of a deep level impurity in p-type material must be above the Fermi level (of the semiconductor material in equilibrium) in the lower half of the band gap.

Such a device in which charge transport takes place via the interior of the semiconductor layer and in which the generation of the charge packets is based on excitation of majority charge carriers trapped in the deep level centers and their release into the potential minima in the layer rather than the normal generation of electron-hole pairs by absorption of radiation has significant advantages when it is desired to form a monolithic charge coupled device for converting a radiation pattern in a particular wavelength range into electrical signals. Thus although in most instances cooling of the semiconductor body will be required it is no longer essentially necessary to employ a semiconductor material having an energy band gap which is less than the photon energy of the incident radiation to which the device is to be sensitive. In particular the advantage arises that for an infra-red imaging charge coupled device it is possible to use silicon with its inherent advanced technology, the deep level impurity concentration being chosen to provide a sensitivity to infra-red radiation in a certain wavelength band.

In a device in accordance with the invention the deep level impurity concentration in the layer will be of a value in excess of the value corresponding, for a layer of the same semiconductor material and thickness and containing only a doping impurity concentration characteristic of the one conductivity type, so that which produces the maximum possible magnitude of net charge in the bulk of the layer which in a steady state still enables the formation of depletion regions extending across the whole thickness of the semiconductor layer while avoiding breakdown. It is mentioned that at least in this respect the device structure is distinguished from previously proposed charge coupled devices operative with the charge transport occurring via the interior of the semiconductor layer and said layer comprising more than one impurity concentration. In practice the said maximum possible magnitude of the net charge that can exist in the bulk of the layer will depend on the particular material of the layer of the one conductivity type. However for a silicon layer in a device structure which enables the layer to be depleted from opposite sides of the magnitude of the net charge should be less than $4 \times 10^{12}$ per sq. cm. As will be described in greater detail hereinafter, for efficient conversion of incident radiation the value of the deep level concentration will be chosen to be of such a value that the magnitude of the net charge in a steady state is considerably in excess of said limiting value, that is in the case described for a device comprising such a silicon layer which can be depleted from opposite major sides the value of the deep level concentration will be chosen to produce a net charge in a steady state considerably in excess of $4 \times 10^{12}$ per sq.cm.

The operation of a device in accordance with the invention is based inter alia on the ability to be able to fully deplete the semiconductor layer during a period of radiation integration without the occurrence of avalanche breakdown and this therefore means that during a period of integration of radiation a non-equilibrium condition exists and the net charge within the depletion regions has to be kept below the said maximum possible magnitude. Obviously one could consider the case, which is outside the scope of the present invention, where the total number of impurities, that is the sum of the dopant and deep level impurities, is limited so that in a steady state the said maximum possible magnitude of net charge could not be exceeded but such a structure would not be very sensitive and would be very slow in response.

The device structure in accordance with the invention is based inter alia on the recognition that the quantum efficiency of the device is dependant upon the number of majority carriers trapped on deep level centers incorporated in the layer and by providing a very large number of the said deep level centers and in operation integrating over a sufficiently short period that the number of such centers which release a trapped majority carrier and therefore increase the net charge in the depletion regions does not cause the said maximum possible magnitude of net charge in the depletion regions to be exceeded, a high sensitivity consistent with bulk or buried channel charge coupled device operation can be obtained. Theoretically if the number of deep level centers were limited as already mentioned so that even in a steady state the said maximum possible magnitude of net charge could not be exceeded then one could have a very long period of integration. However with such a relatively small number of deep level centers to intercept the radiation most of the radiation input would be wasted, that is not intercepted by the deep level centers.

The operation of a device in accordance with the invention is also based on the requirement that thermally induced changes in the charge state of the deep level centers occur at a slower rate than the optically induced changes, that is the generation within the depletion regions of free majority charge carriers by radiation excitation must be at an appreciably higher rate than by thermal excitation. This to a certain extent will depend on the choice of the particular deep level impurity and temperature of operation as will be described in greater detail hereinafter.

Various possibilities exist for the provision of the doping impurity concentration and the deep level impurity concentration. In one form the deep level impurity concentration is greater than the doping impurity concentration. In such a form the deep level impurity concentration will comprise a deep level donor in an n-type layer or a deep level acceptor in a p-type layer. In this form the charge state of the deep level centers in the depletion regions in equilibrium is neutral, namely a donor center having a single trapped electron or an acceptor center having a single trapped hole is in a neutral state, and may change respectively to a positive or negative charge state by optical excitation. It may also be possible to use centers which can trap two carriers and the optical excitation be such as to cause loss of only one carrier from the center, these being so-called double-negative or double-positive centers.

In another form of the device in accordance with the invention the doping impurity concentration is greater than the deep level impurity concentration which is provided as a compensating impurity. In such a form the deep level impurity concentration may comprise a deep level acceptor in an n-type layer or a deep level donor in a p-type layer. In this form the charge state of the deep level centers in the depletion region in equilibrium respectively is negative and positive, namely an acceptor center having a single trapped electron is in a negative charge state and a donor center having a single trapped hole is in a positive charge state, and may change to a neutral state by optical excitation. In this form the possibility may also exist of using impurities which yield so-called double-negative or double-positive centers.

In some forms of the device the deep level impurity concentration is formed by at least one deep level impurity element introduced into the crystal lattice of at least part of the layer of the one conductivity type. Various elements may be used depending on the semiconductor material and the wavelength range of the radiation but by definition the response will be confined to a wavelength range corresponding to energy values less than the energy band gap of the semiconductor material.

In other forms of the device the deep level impurity concentration is formed by defects introduced into the crystal lattice of at least part of the layer of the one conductivity type. Such defects producing deep level centers may be formed by radiation damage, for example by proton or electron bombardment. The defects may act as compensating centers.

The layer of the one conductivity type may comprise a first portion in which transport of free majority charge carriers can be effected and a second portion in which generation of free majority charge carriers can be effected by radiation in the said wavelength range, the deep level impurity concentration being confined substantially to the second portion of the layer. In such a form the transport of charge carriers takes place via an interior part of the layer which is substantially separated from the part of the layer where the free charge carriers are generated by radiation excitation. However within the scope of the invention there are also devices in which the deep level impurity concentration is not localized in the said manner and the charge transport takes place via an interior part of the layer where the deep level impurity concentration is present.

When the deep level impurity concentration is confined substantially to a portion of the layer, namely the second portion as in the above-described form, and when such a deep level impurity concentration is provided as a compensating impurity concentration then the doping impurity concentration is the remainder of the layer of the one conductivity type, namely in the first portion in the above-described form, must be of a sufficiently low value that the said maximum value of net charge is not exceeded.

Various configurations of an electrode system, forming part of the device, with respect to the location of the layer portion or portions comprising the deep level impurity concentration are possible. Thus in a first form an electrode system for capacitively producing electric fields in the semiconductor layer by means of which discrete packets of majority charge carriers as released by exciting radiation are introduced into depletion regions and transported to the charge reading means is present at one major side of the layer and the said second layer portion comprising the deep level impurity concentration is present adjoining the layer surface at said one major side. This structure may be readily realized in manufacture and various alternative methods of providing the deep level impurity concentration may be employed as will be described hereinafter.

In a second form an electrode system for capacitively producing electric fields in the semiconductor layer by means of which discrete packets of majority charge carriers as released by exciting radiation are introduced into depletion regions and transported to the charge reading means is present at one major side of the layer and the second layer portion comprising the deep level impurity concentration is present adjoining the layer surface at the opposite major side of the layer. In this form the situation of the electrode system and the second layer portion at opposite major sides of the layer enables other structural and manufacturing features to be advantageously employed.

In one example of said second form an enhanced charge handling capacity of the device is obtained with a structure in which the layer of the one conductivity type comprises a more highly doped surface region extending adjacent the one major side, said more highly doped surface region extending over only part of the thickness of the layer and spaced from the portion comprising the deep level impurity concentration. For further explanation of the mechanism whereby the charge handling capacity of a buried or bulk channel charge coupled device is increased by the provision of such a more highly doped surface layer reference to invited to U.S. Pat. No. 4,012,759

In both the said first and second forms of the device the layer of the one conductivity type may be present adjoining a semiconductor region of the opposite conductivity type, the electrode system being present at the major side of the layer remote from the region of the opposite conductivity type. Said region of the opposite conductivity which forms a p-n junction with the layer of the one conductivity type serving for at least part of the isolation of the layer from its surroundings in the operation of the device may be present as a substrate of said opposite conductivity type on which the said layer of the one conductivity type is present. However in one example of the said second form of the device the region of the opposite conductivity type is present as a surface layer, for example a diffused surface layer, at the said opposite major side of the layer which in this example constitutes the semiconductor body. In this form it is possible to provide the deep level impurity concentration in a portion which extends over a substantial part of the thickness of the layer and thus, by virtue of the large number of deep level impurity charge trapping centers thereby provided, enable a high detectivity to be obtained.

In one example of a charge coupled device in accordance with the invention in which the deep level impurity concentration is greater than the doping impurity concention, the layer is of p-type silicon, the deep level impurity concentration comprises at least one of the elements indium and thallium and provides a sensitivity to infra-red radiation in the wavelength band of between 3 microns and 5 microns. In another example in which the deep level impurity concentration is greater than the doping impurity concentration the layer is of p-type silicon, the second impurity concentration is of gallium and provides a sensitivity to infra-red radiation in the wavelength band of between 8 microns and 14 microns.

When using an n-type silicon layer in a device in which the deep level impurity concentration is greater than the doping impurity concentration then the deep level impurity is one which yields donor states. One such example is sulphur.

Reference has already been made to devices in accordance with the invention in which the doping impurity concentration is greater than the deep level impurity concentration which is provided as a compensating impurity concentration. Such a compensating impurity concentration may be provided by acceptors in the upper half of the band gap or donors in the lower half of the band gap. These impurities may be dopant impurities or defects but must have energy levels located a suitable distance from the band edge, namely the conduction band edge in n-type silicon and the valence band edge in p-type silicon, to give the desired response to radiation in the particular wavelength range for which the device is destined for operation. When using a silicon layer one suitable compensating impurity is gold which has a compensating level of 0.35 eV from the valence band edge in p-type silicon and provides a sensitivity to radiation of wavelengths from 1.1 micron to approximately 3.5 microns. Gold also provides a compensating level of 0.55 eV from the conduction band edge in n-type silicon and provides a sensitivity to radiation of wavelengths from 1.1 micron to approximately 2.25 microns. As an alternative, compensating centers may be provided by defect levels produced by radiation damage. Protons, for example, can produce compensating centers in n-type silicon with a level of approximately 0.4 eV from the conduction band edge and provide a sensitivity to radiation of wavelengths from 1.1 microns to approximately 3 microns.

The deep level impurity concentration may be present as an ion implanted concentration. The use of ion implantation to provide the deep level impurity concentration is advantageous because it enables an impurity element or elements to be uniformly distributed over a given area, which is highly desirable in an imaging device, and to be precisely confined in the portion of the layer where desired consistent with providing sufficient majority charge carrier trapping centers. This confinement may be important in those forms of the device in which operation may be degraded by the presence of any charge trapping centers in the interior part of the layer where charge transport is effected.

Furthermore, ion implantation being a nonequilibrium process enables the introduction of impurity elements having a normally relative low solid solubility in the semiconductor material.

As the optical cross-section of deep level centers will be small, to provide the free majority charge carriers by radiation excitation it is desirable that the value per sq.cm. of the deep level impurity concentration centers should be at least $5 \times 10^{12}$ and even as high as $10^{16}$ per sq.cm. In practice such a concentration may be difficult to achieve in a thin layer because of limitations of the solid solubility of the deep level impurities in the particular semiconductor material. However when using high concentrations the problem arises that if the charge state of a substantial fraction of the deep level impurities is changed in the depletion regions then it would not be possible to fully deplete the semiconductor layer while avoiding breakdown and such layer depletion is a basic requirement for the satisfactory charge transfer operation of the charge coupled device. In practice when using such high concentrations this problem is avoided by controlling the integration period, that is the period in which the radiation can be incident on a particular imaging elemental portion of the layer between successive refreshing steps in which the deep level centers are replenished with majority charge carriers to be such that in said period with maximum radiation intensity not more than a certain number of the centers have their charge state changed, for example not more than $10^{12}$ centers per sq.cm. in said integration period.

Thus in the operation of a charge coupled device in accordance with the invention it is necessary to periodically refresh the semiconductor layer portion containing the deep level impurity concentration by way of replenishing the deep level centers with majority charge carriers.

The semiconductor layer may further comprise electrode means for enabling the periodic replenishing of the deep level centers with majority charge carriers. In other forms the replenishment may be effected, as will be described hereinafter, by suitable configuration of the circuit means used for the device operation.

According to a further aspect of the invention there is provided an arrangement comprising a charge coupled device in accordance with the invention, circuit means for supplying periodic signals to an electrode system associated with the layer for forming depletion regions in the semiconductor layer within which discrete packets of majority charge carriers as released by exciting incident radiation from the centers provided by the deep level impurity concentration can be collected and transported to the reading means in a direction parallel to the layer via an interior part of the layer, and circuit means for enabling the periodic replenishing of the centers provided by the deep level impurity concentration with majority charge carriers.

In a first form of such an arrangement the circuit means for enabling the periodic replenishing of the deep level impurity centers with majority charge carriers comprises means for discharging the depletion regions which also extend through the part of the layer containing the deep level impurity concentration.

In another form of the arrangement the semiconductor layer comprises an input stage for the generation of packets of majority charge carriers which can be transported in a direction parallel to the layer and the circuit means for enabling the periodic replenishing of the deep level centers with majority charge carriers comprises means for applying signals to the input stage for periodically introducing refreshing charge packets of majority charge carriers of such magnitude that as they are transported through the layer they extend at least into the part of the layer containing the deep level impurity concentration.

Figure 2:
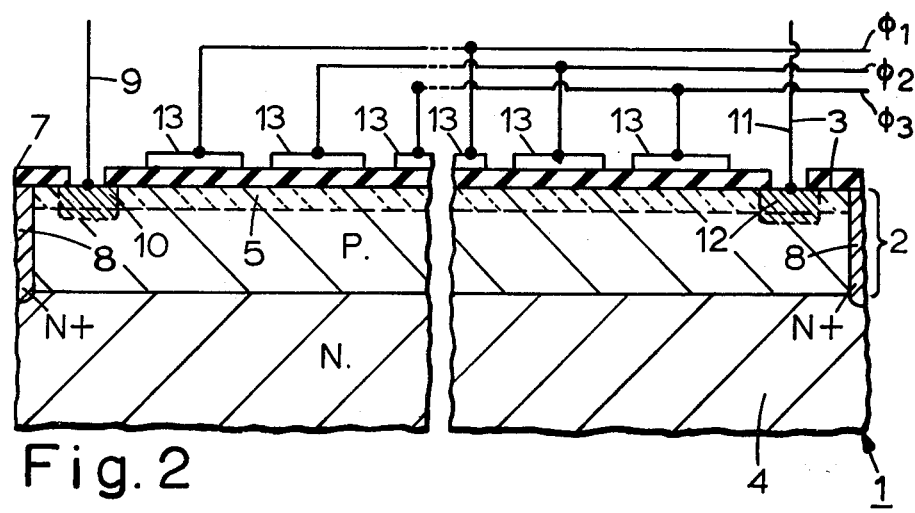
Figure 3:
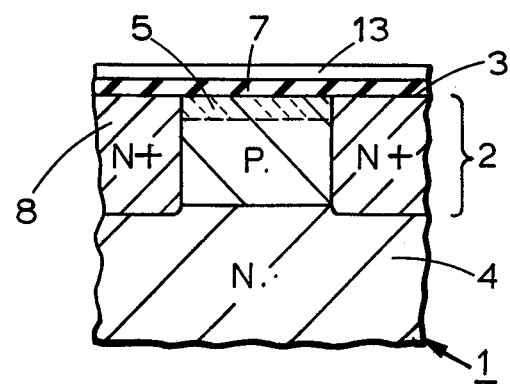

Embodiments of the invention will now be described, by way of example, with reference to the accompanying diagrammatic drawings, in which:

FIG. 1 is a plan view of part of a charge coupled device in accordance with the invention which is suitable for imaging an infra-red radiation pattern, FIG. 2 is a sectional view of the device shown in FIG. 1 taken along the line II—II of FIG. 1, FIG. 3 is a sectional view of the device shown in FIG. 1 taken along the line III—III of FIG. 1, FIG. 4 is a sectional view of another charge coupled device in accordance with the invention which is suitable for imaging an infra-red radiation pattern, FIG. 5 is a cross-sectional view of the device shown in FIG. 4 taken through an electrode 13 of FIG. 4, and FIG. 6 is a diagrammatic representation of the waveforms of the potential applied to the electrodes of the device shown in FIGS. 4 and 5 when in operation for imaging an infra-red radiation pattern.

Referring now to FIGS. 1 to 3 there is shown a simplified form of embodiment consisting of a CCD infra-red imaging device of which the elemental imaging parts are in the form of a linear array. Obviously within the scope of the invention are also devices in which the elemental imaging parts are in the form of a two-dimensional array, a so-called area imager, but for the sake of clarity of illustration and description of the device structure in accordance with the invention the linear array embodiment of FIGS. 1 to 3 will be described.

The device comprises a semiconductor body 1 of silicon having a p-type semiconductor layer 2 adjoining the surface 3, said layer 2 being present on an n-type substrate 4. The substrate 4 is of 200 microns thickness and has a resistivity of 10 ohm.cm. The layer 2 is of 6 microns thickness and comprises a surface adjoining portion 5 in which there is an ion implanted concentration of indium. The layer 2 is doped with boron in a substantially uniform concentration of $10^{15}$ atoms cm$^{-3}$, that is approximately $6 \times 10^{11}$ impurities per sq.cm. in any plane of the layer. The ion implanted concentration of indium extends to a depth from the surface 3 of 2 microns and the peak concentration is at a depth of 0.25 microns from the surface. The dose used for forming the ion implanted concentration of indium is $5 \times 10^{14}$ per sq.cm.

The n-type substrate 4 together with the p-n junction between the substrate 4 and layer 2 form part of means for isolating the semiconductor layer 2 from its surroundings at least during operation of the device. Said isolation means additionally comprise an insulating layer 7 of silicon oxide on the surface 3 and an n-type surface region 8 which as shown in the plan view of FIG. 1 laterally surrounds the p-type layer 2. In the present embodiment the region 8 is an n+-diffused region which extends throughout the thickness of the layer 2 and into the substrate 4. For the electrical isolation of the layer 2 the p-n junction between the region 8 and the layer 2 may be suitably reverse biased, the connection to the region 8 being via a connection to the substrate 4. In other embodiments it is possible to employ instead of the region 8 a sunken insulating layer or to have an n-type region which extends from the surface 3 of the layer over only part of the thickness of the layer 2. In the latter case operation is effected with such applied potentials that the depletion regions associated with the substrate/layer p-n junction between the n-type surface region and the p-type layer 2 complete the isolation.

The thickness and the boron doping of the p-type layer 2 is such that by means of an electric field a depletion region can be formed extending throughout the thickness of the layer 2 while avoiding breakdown. By using such a layer 2 which in operation can be isolated from the surroundings, charge in the form of majority charge carriers, in particular the last fractions of charge packets to be moved between storage sites, can be transported mainly via the interior of the layer.

The charge which forms pattern information is introduced into depletion regions formed in the part of the layer 2 situated below the surface portion 5 from deep acceptor levels provided by the ion implantated impurity concentration of indium. At the temperature of operation substantially all these impurities are unionized and the said deep acceptor levels form trapping centers for holes which can be released upon excitation by infra-red radiation in the wavelength band of 3 microns to 5 microns. The extent of the surface portion 5 and the applied potentials at various parts of the device as will be described hereinafter are such that the potential minima in the depletion regions formed in the layer 2 will be situated at positions spaced from the surface portion 5. Thus, provided the size of a pattern information representing charge packet does not exceed a certain value, as can be determined by other operational features as will be described hereinafter, the transport of the charge packets representative of pattern information can be effected via an interior part of the layer without the charge packets thereby extending to the surface portion 5 containing the trapping centers as provided by the implanted concentration of indium. Thus pattern information in the form of discrete packets of majority charge carriers in storage sites in the layer 2 can be generated when incident infra-red radiation in the said wavelength band penetrates to the surface portion 5. In the present embodiment in which the layer 2 is doped with acceptor impurities, both in the main bulk of the layer and the surface portion 5, this means that the pattern information generated via the deep level centers, introduced into storage sites in the layer and thereafter transported through the layer is in the form of holes.

At one end of the layer there is a more highly doped p-type surface region 10 on which an input connection conductor 9 is present. At the other end of the layer there is a more highly doped p-type surface region 12 on which an output connection conductor 11 is present. The input connection conductor 9 and surface region 10 enable further introduction of holes into the layer 2, this introduction and thereafter transport through the layer being effected, as will be described hereinafter, to periodically replenish the deep acceptor levels, as provided by the ion implanted concentration of indium, with holes. The output conductor 11 and surface region 12 is used as part of a means for reading the size of the charge packets and for removal of the charge packets from the layer but this part of the operation will not be described in detail as it may be effected in a conventional manner.

On the surface of the layer 2 there is an electrode system for capacitively generating electric fields in the layer 2 by means of which pattern information representing charge packets can be collected and thereafter transported to the read-out means (11, 12) in a direction parallel to the layer. The electrode system comprises a large plurality of electrodes 13 in the form of conductive layers which are separated from the semiconductor layer 2 by the silicon oxide layer on the surface 3. The device structure is suitably arranged with respect to the intended direction of incidence of the radiation pattern. Thus, for example, if the infra-red radiation pattern to be recorded is to be directed at the upper surface then the electrodes 13 are chosen to be of a material and thickness which will allow transmission of said radiation, for example the electrodes may·be of polycrystalline silicon. Alternatively when using a silicon body of the said dimensions the radiation pattern may be directed at the lower side of the body, as infra-red radiation in the said wavelength band will be transmitted by the substrate 4 and layer 2, thus reaching the portion 5 containing the deep level impurity centers.

In a direction perpendicular to the intended direction of charge transport the electrodes extend across the entire width of the semiconductor layer 2 as is shown in FIGS. 1 and 3. The device as shown in FIGS. 1 to 3 is operated as a three-phase charge coupled device in which the electrodes 13 are connected in three groups to clock lines $\phi_1$, $\phi_2$ and $\phi_3$ for applying clocking voltages. It will be appreciated however that the electrode configuration in a device in accordance with the invention may be other than as shown in the present embodiment, for example the electrodes may be formed of polycrystalline silicon at different levels and in an overlapping relationship, the electrodes may be provided on insulating layer parts of different thickness, and other known means may be employed. Furthermore the device may be constructed, for example, for two-phase or four-phase operation.

For a full description of the charge transfer operation of a charge coupled device of the form in which the transport occurs via the interior of the semiconductor layer reference is invited to United Kingdom patent specification No. 1,414,183 which corresponds to U.S. Ser. Nos. 505,663; 653,131; 653,472 and 674,065. The operation of the device shown in FIGS. 1 to 3 in so far as it concerns the formation of electrical signals representative of an infra-red radiation pattern will now be described.

The substrate 4 is set at a reference potential, for example earth, while a voltage of approximately $-10$ volts is applied to the layer 2, for example via the input contact 9. The clock voltages applied to the lines $\phi_1$, $\phi_2$ and $\phi_3$ vary for example, between $+20$ volts and $+5$ volts. Starting from the situation where the free majority carriers, that is untrapped holes, are removed from the layer 2, it can be calculated that for holes potential minima in the depleted parts of the semiconductor layer below the electrodes 13 are obtained at a depth of approximately 5 microns. In said potential minima charge packets in the form of holes, released by infra-red radiation excitation from the deep levels provided by the implanted concentration of indium in the surface portion 5, can be introduced. In any one elemental imaging portion (bit) defined below a group of three adjacently situated electrodes 13 the holes released by the exciting radiation and collected in the potential minima can be concentrated below one of the electrodes, for example the one connected to the line $\phi_3$, to which the lowest voltage is applied. By suitable choice of the clock voltages thereafter applied to the electrodes said charge packets as collected, for example below the electrodes connected to the line $\phi_3$, can be transported to a region below the next succeeding electrodes, and so on. In this manner the charge packets initially collected under the electrodes connected to the line $\phi_3$ are sequentially transferred to the read-out means (11, 12) where they are removed. The charge transport of the last fractions of the charge packets can take place at a comparatively large distance from the electrodes 13 and also from the surface portion 5.

The device is operated in a cyclical mode wherein at the commencement of a frame period the deep level centers are first replenished with majority charge carriers. Thereafter in said period there is an imaging integration period in which pattern information is converted into discrete packets of charge present in depletion regions formed below the electrodes 13 and in each bit collected in the depletion regions below the electrodes connected to the clocking line $\phi_3$, said charge packets being of a size dependent upon the total local intensity during the integration period of the infra-red radiation incident in the relevant part of the surface portion 5 of the layer below the three electrodes 13 of that imaging bit. Thereafter in the said frame period the pattern information representing charge packets is sequentially transferred to the read-out means and removed from the layer before the commencement of the next frame period.

The first stage, namely the replenishing of the deep levels in the surface portion 5 with holes is effected in this embodiment by introducing over-size charge packets at the input (9, 10) and transferring them to the output. By the term "over-size" there is to be understood charge packets of such magnitude that as they pass through the layer they will be located in part in the surface portion 5 and there donate holes to the unoccupied deep levels. In an alternative form the deep levels are replenished by connecting all the electrodes 13 simultaneously to ground potential in order to discharge the depletion regions including the portions thereof formed in the surface portion 5.

With the high photon flux occurring in the infra-red region of the spectrum in many instances the frame period can be relatively short, for example in the case of a 100 bit linear array the frame period may be 100 microseconds of which the integration period is 95 microseconds. The actual frame period will be determined by a number of factors in any particular case, including the nature and concentration of the deep level impurity. Thus the frame period may be, for example as long as 40 milliseconds and as short as 10 microseconds. In any particular case using a silicon layer the net charge within the depletion regions cannot exceed approximately $4 \times 10^{12}$ per sq.cm. since the breakdown field would be exceeded. The duration for the imaging integration period part of the frame period is chosen in conjunction with the concentration of the deep level impurity so that with infra-red radiation of maximum intensity incident throughout said period on any one elemental imaging portion below a group of electrodes 13 forming one bit the charge packet as generated in the part of the layer below the surface portion 5 will be confined to said part and during subsequent transport to the output means will not extend to the surface portion 5 containing the trapping centers.

A further embodiment of the invention will now be described with reference to FIGS. 4 to 6. In this device parts corresponding to those shown in FIGS. 1 to 3 are indicated by the same reference numerals. The main difference resides in the p-type silicon epitaxial layer 2 being of a much greater thickness and having different impurity distributions. Thus the layer 2 is of 35 microns thickness overall and contains boron throughout its thickness in a background concentration of $10^{14}$ atoms cm$^{-3}$. The layer 2 has a first portion 16 of approximately 25 microns thickness provided adjoining the substrate 4 and containing as a deep level impurity a concentration of indium of $5 \times 10^{16}$ cm$^{-3}$ which corresponds to a value of $1.25 \times 10^{14}$ impurities per sq.cm. Adjacent the surface 3 of the layer 2 and separated from the portion 16 containing indium by a portion 17 containing substantially only the background concentration of boron there is a more highly doped portion 18 of approximately 1 micron thickness containing an additional diffused concentration of a suitable acceptor, for example boron having a concentration of $5 \times 10^{15}$ cm$^{-3}$. In this device the isolation is in part obtained with the aid of the n$^+$-surface region 19, which extends only partly through the layer 2, by applying a suitable reverse bias across the p-n junction between the region 19 and the layer 2 such that the depletion region associated with this junction extends at least to the depletion region associated with the reverse biased p-n junction between the n-type substrate 4 and the p-type layer 2.

Operation of this device may be effected in a similar manner to that described for the previous embodiment. In this embodiment the electrode structure is suitably formed to allow transmission of infra-red radiation in the wavelength band of between 3 microns and 5 microns. However the device structure may be readily modified to form an embodiment in which the radiation pattern is directed from the substrate side.

FIG. 6 shows the waveform diagrams of the voltages applied to the lines $\phi_1$, $\phi_2$, $\phi_3$ and the voltage of the input electrode $V_{in}$. In this mode of operation the potential applied to the p+-region 10 normally determines the potential applied to the layer 2 and with respect to the substrate which is grounded is −50 volts. For replenishing the deep level impurity centers with majority charge carriers the potential $V_{in}$ is temporarily relaxed to the substrate potential. During this period, designated $t_{ri}$ the deep level centers provided by the indium concentration are replenished with holes due to the depletion regions in the layer being fully discharged. Following the period $t_{ri}$ the CCD is reset for a period indicated by $t_{rs}$ during which substantially all free majority charge carriers are removed from the layer. At the end of the period $t_{rs}$ the voltages on the lines $\phi_1$, $\phi_2$ and $\phi_3$ are held at constant levels for a period $t_{im}$ in which imaging of the infra-red pattern occurs and the charge packets of holes as generated, as previously described, by the exciting radiation are collected below the electrodes $\phi_3$ in each portion. Thereafter in a readout period $t_{ro}$ these charge packets are clocked out to the output electrode 12 and read by means not shown. The clocking voltages on the lines $\phi_1$, $\phi_2$, $\phi_3$ will be chosen according to a number of different factors, and may vary in one example between 5 volts and 25 volts. If it is desired to bring the charge packets nearer to the surface 3 then lower clocking voltages may be used, and in another example these voltages will be negative with respect to the substrate.

It will be appreciated that various manufacturing techiques known in the art may be employed in the formation of the embodiments so far described and in other modifications as will be described hereinafter. In the manufacture of the embodiment described with reference to FIGS. 4 and 5 the p-type layer comprising the layer portions 16, 17 and 18 may be provided in two stages. Thus the layer part in which the deep level impurity is to be provided may be first provided by epitaxy on the substrate 4, thereafter the deep level impurity provided in said layer part by ion implantation or diffusion, and then the remaining layer part provided by a second epitaxial deposition step, the more highly doped surface portion 18 being provided, for example, by a subsequent diffusion step. As an alternative to providing the deep level impurity by ion implantation or diffusion the first stage epitaxy may be carried out to simultaneously deposit the deep level impurity with the background impurity element, for example, which determines the conductivity of said layer part.

It will be appreciated that for the desired operation of the described embodiments it will be necessary to cool the semiconductor body. The actual temperature of operation will be determined by the nature of the deep level impurity. It is essential that the rate of thermal excitation of the deep level centers is appreciably less than the rate of optical excitation. Thus for a silicon infra-red imaging device for operation in the 3 micron to 5 micron band cooling to 77° K. should give acceptable operation when using a p-channel CCD with thallium as the deep level impurity. The already described alternative element indium may necessitate further cooling. For a silicon device for operation in the waveband range of 8 microns to 14 microns cooling to a low temperature may be required for satisfactory operation, for example cooling to 20° K. However, such cooling is considered to be quite acceptable having regard to the fact that by use of the device structure in accordance with the invention in which using an extrinsically doped semiconductor layer of a certain material, for example silicon, the sensitivity of the device is effectively extended into a wavelength band where the photon energy is substantially less than the band gap of the semiconductor material.

Although the embodiments described are elementary linear arrays it will be appreciated that a device in accordance with the invention may be of more complex configuration. Thus, a so-called area imaging device may be formed and various means of reading the charge as used in conventional imaging CCD's may be used, for example a sensor may additionally comprise a masked array of elements corresponding in number to the elements used in the imaging array and serving as a store which is readout through a series-parallel CCD conversion stage.

Two further embodiments of the invention will now be described, these embodiments being modifications of the embodiment described with reference to FIGS. 1 to 3. In the first of said further embodiments the deep level impurity is provided as a compensating deep level donor impurity throughout the layer 2 which is more highly doped with boron, namely a boron concentration of $5 \times 10^{16}$ atom cm$^{-3}$ which is approximately $2 \times 10^{13}$ atoms per sq.cm., than in the embodiment described with reference to FIGS. 1 to 3. The layer thickness is less, namely 4 microns in this embodiment. The deep level impurity concentration is provided by gold which has been introduced into the layer by ion implantation and in an amount approaching the boron concentration. In other respects the structure is similar to that described with reference to FIGS. 1 to 3. However the operation differs at least in so far as the transport of radiation generated free majority carriers is effected through a part of the silicon layer in which the deep level trapping centers provides by the gold are present.

In this embodiment the compensating deep level centers provided by the gold provide a sensitivity to infrared radiation in a wavelength range extending from 1.1 microns to approximately 3.5 microns.

In a second further embodiment which is a further modification of the embodiment described with reference to FIGS. 1 to 3, the conductivity types are all reversed, namely the substrate 4 is of p-type silicon, the layer 2 is of n-type silicon and the isolating region 8 is p-type. The n-type layer which in this embodiment is of 4 microns thickness, is substantially uniformly doped with phosphorus in a concentration corresponding to $4 \times 10^{13}$ atoms per cm$^2$. The deep level impurity concentration is provided by compensating defects produced in the crystal lattice of the layer by proton bombardment. The proton bombardment has been optimized to yield a defect density which varies with depth in the layer and has a peak concentration approaching that of the phosphorus concentration, the portion of the n-type layer adjacent the surface 3 immediately below the insulating layer 7 having an appreciably lower defect density such that the phosphorus concentration at this area, namely over a distance of approximately 0.1 micron from the surface 3, is relatively uncompensated. In this embodiment the deep level centers produced by the defects provide a sensitivity to infra-red radiation in a wavelength range extending from 1.1 microns to approximately 3 microns.

In this structure the relatively uncompensated surface layer provides substantially the same advantages of a higher charge handling capacity as provided by the more highly doped surface 18 in the embodiment described with reference to FIGS. 4 to 6.

In any of the embodiments described it is alternatively possible to provide the deep level impurity in the form of a plurality of discrete portions extending at the same level in the layer rather than a continuous layer portion, said discrete portions extending locally in registration with the electrodes provided at the major surface of the layer.

What is claimed is:

1. A charge coupled device for converting an electromagnetic radiation pattern in a certain wavelength range into electrical signals comprising means for reading charge and a semiconductor body having a semiconductor layer of one conductivity type in which pattern information in the form of discrete packets of majority charge carriers can be generated and transported via the interior of the semiconductor layer to said means for reading the charge, the layer comprising a concentration of at least one shallow level doping impurity characteristic of the one conductivity type and a concentration of at least one deep level doping impurity which provides deep level centers for trapping majority charge carriers which can be released upon excitation by radiation in said wavelength range, said shallow level doping impurity concentration and the deep level doping impurity concentration being such that depletion regions can be formed extending through the thickness of the layer while avoiding breakdown only as a result of substantially all the deep level centers within the depletion regions being full of majority charge carriers characteristic of the one conductivity type, and the deep level doping impurity concentration being formed by defects introduced into the crystal lattice of at least part of the layer of the one conductivity type.

2. A charge coupled device as claimed in claim 1, wherein the layer of the one conductivity type comprises a first portion in which transport of free majority charge carriers can be effected and a second portion in which generation of free majority charge carriers can be effected by radiation in said wavelength range, the deep level doping impurity concentration being confined substantially to the second portion of the layer.

3. A charge coupled device as claimed in claim 1, wherein an electrode system for capacitively producing electric fields in the semiconductor layer by means of which discrete packets of majority charge carriers as released by exciting radiation are introduced into depletion regions and transported to the charge reading means is provided at one major side of the layer and said second layer portion comprising the deep level doping impurity concentration is provided adjoining the layer surface at said one major side.

4. A charge coupled device as claimed in claim 3, further comprising a semiconductor region of a conductivity type opposite to that of said one conductivity type, wherein the layer of the one conductivity type is provided adjoining said semiconductor region of the opposite conductivity type, the electrode system being present at the major side of the layer remote from the region of the opposite conductivity type.

5. A charge coupled device as claimed in claim 1, wherein an electrode system for capacitively producing electric fields in the semiconductor layer by means of which discrete packets of majority charge carriers as released by exciting radiation are introduced into depletion regions and transported to the charge reading means is provided at one major side of the layer and the second layer portion comprising the deep level doping impurity concentration is provided adjoining the layer surface at the opposite major side of the layer.

6. A charge coupled device as claimed in claim 5, wherein the layer of the one conductivity type comprises a more highly doped surface region extending adjacent the one major side, said more highly doped surface region extending over only part of the thickness of the layer and being spaced from the portion comprising the deep level doping impurity concentration.

7. A charge coupled device as claimed in claim 1, wherein the semiconductor layer is of silicon and the deep level doping impurity concentration is chosen to provide a sensitivity to infra-red radiation in a selected wavelength range.

8. A charge coupled device as claimed in claim 7, wherein the layer is of p-type silicon and the deep level doping impurity concentration comprises proton-bombardment-induced defects in the crystal lattice and provides a sensitivity to infra-red radiation in a wavelength range of between about 1.1 and 3.0 microns.

9. A charge coupled device as claimed in claim 1, wherein the deep level doping impurity concentration is present as an ion implanted concentration.

10. A charge coupled device as claimed in claim 1, wherein the deep level doping impurity concentration is in the range of about $5 \times 10^{12}$ impurities per sq.cm. to $10^{16}$ impurities per sq.cm.

11. A charge coupled device as claimed in claim 1, wherein the semiconductor layer further comprises electrode means for periodically replenishing the centers provides by the deep level doping impurity concentration with majority charge carriers.

12. An arrangement comprising a charge coupled device as claimed in claim 1, and further comprising an electrode system associated with the semiconductor layer, circuit means for supplying periodic signals to said electrode system for forming depletion regions in the semiconductor layer within which discrete packets of majority charge carriers as released by exciting incident radiation from the center provided by the deep level doping impurity concentration can be collected and transported to the reading means in a direction parallel to the layer via an interior part of the layer, and circuit means for periodically replenishing the centers provided by the deep level doping impurity concentration with majority charge carriers.

13. An arrangement as claimed in claim 12, wherein the circuit means for periodically replenishing the deep level impurity centers with majority charge carriers comprise means for discharging the depletion regions which also extend through the part of the layer containing the deep level doping impurity concentration.

14. An arrangement as claimed in claim 12, wherein the semiconductor layer comprises an input stage for the generation of packets of majority charge carriers which can be transported in a direction parallel to the layer and the circuit means for periodically replenishing the deep level impurity centers with majority charge carriers comprises means for applying signals to the input stage for periodically introducing refreshing charge packets of majority charge carriers of such magnitude that as they are transported through the layer they extend at least into the part of the layer containing the deep level doping impurity concentration.

* * * * *